US012139396B2

(12) United States Patent
Rizzini et al.

(10) Patent No.: US 12,139,396 B2
(45) Date of Patent: Nov. 12, 2024

(54) MICROELECTROMECHANICAL SENSOR DEVICE WITH IMPROVED STABILITY TO STRESS

(71) Applicant: STMICROELECTRONICS S.R.L., Agrate Brianza (IT)

(72) Inventors: Francesco Rizzini, Passirano (IT); Carlo Valzasina, Gessate (IT); Gabriele Gattere, Castronno (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 546 days.

(21) Appl. No.: 17/384,566

(22) Filed: Jul. 23, 2021

(65) Prior Publication Data

US 2022/0041429 A1 Feb. 10, 2022

(30) Foreign Application Priority Data

Aug. 7, 2020 (IT) .......................... 102020000019729

(51) Int. Cl.
*B81B 3/00* (2006.01)
*G01P 1/00* (2006.01)
*G01P 15/125* (2006.01)

(52) U.S. Cl.
CPC .............. *B81B 3/0072* (2013.01); *G01P 1/00* (2013.01); *G01P 15/125* (2013.01);
(Continued)

(58) Field of Classification Search
USPC ...................................................... 73/514.32
See application file for complete search history.

(56) References Cited

U.S. PATENT DOCUMENTS 6,149,190 A * 11/2000 Galvin ................ G01P 15/0802
73/514.32
6,170,332 B1 * 1/2001 MacDonald ............ G01P 1/006
73/514.32

(Continued)

FOREIGN PATENT DOCUMENTS

| EP | 1 640 726 A1 | 3/2006 |
|----|--------------|--------|
| EP | 2 514 712 A2 | 10/2012 |
| EP | 3 156 804 A1 | 4/2017 |

OTHER PUBLICATIONS

U.S. Appl. No. 17/179,157, filed Feb. 18, 2021.

*Primary Examiner* — Clayton E. LaBalle
*Assistant Examiner* — Warren K Fenwick
(74) *Attorney, Agent, or Firm* — Seed IP Law Group LLP

(57) ABSTRACT

A microelectromechanical sensor device has a detection structure including: a substrate having a first surface; a mobile structure having an inertial mass suspended above the substrate at a first area of the first surface so as to perform at least one inertial movement with respect to the substrate; and a fixed structure having fixed electrodes suspended above the substrate at the first area and defining with the mobile structure a capacitive coupling to form at least one sensing capacitor. The device further includes a single monolithic mechanical-anchorage structure positioned at a second area of the first surface separate from the first area and coupled to the mobile structure, the fixed structure, and the substrate and connection elements that couple the mobile structure and the fixed structure mechanically to the single mechanical-anchorage structure.

20 Claims, 10 Drawing Sheets

(52) U.S. Cl.
CPC ............. *B81B 2201/0235* (2013.01); *B81B 2203/0307* (2013.01); *B81B 2203/04* (2013.01)

(56) References Cited

U.S. PATENT DOCUMENTS

| | | | |
|---|---|---|---|
| 7,121,141 B2 | 10/2006 | McNeil | |
| 8,049,193 B1* | 11/2011 | Appleby | ............. B29C 33/3842 |
| | | | 378/155 |
| 8,689,632 B2* | 4/2014 | Jia | ...................... G01C 19/5762 |
| | | | 73/504.12 |
| 10,274,512 B2* | 4/2019 | Tocchio | ................ G01P 15/125 |
| 10,444,013 B2* | 10/2019 | Prati | .................. G01C 19/5712 |
| 2011/0023604 A1* | 2/2011 | Cazzaniga | .............. G01P 15/02 |
| | | | 73/514.32 |
| 2018/0245920 A1 | 8/2018 | Laghi et al. | |
| 2021/0261403 A1* | 8/2021 | Gattere | ................... G01C 9/00 |
| 2023/0228570 A1 | 7/2023 | Fedeli et al. | |
| 2024/0044932 A1* | 2/2024 | Gattere | ................ G01P 15/125 |

\* cited by examiner

MICROELECTROMECHANICAL SENSOR DEVICE WITH IMPROVED STABILITY TO STRESS

BACKGROUND

Technical Field

The present disclosure relates to a MEMS (Micro-Electro-Mechanical System) sensor device, having improved stability to external stresses or stimuli, which constitute a disturbance with respect to quantities to be detected. The following discussion will make explicit reference, without this implying any loss of generality, to a MEMS sensor device implementing an accelerometer of a capacitive type, designed to detect one or more linear accelerations acting along one or more sensing axes.

Description of the Related Art

MEMS accelerometers are known with sensing axis in the horizontal plane, i.e., ones that include detection structures sensitive to accelerations acting in at least one direction parallel to a plane of main extension thereof and to the top surface of a corresponding substrate of semiconductor material. MEMS accelerometers with vertical sensing axis are also known, i.e., ones that include detection structures sensitive to accelerations acting in a direction orthogonal to the aforesaid plane of main extension. However, known MEMS accelerometers are subject to stress and strain due to temperature variations and the material characteristics of the different materials of which they are made. The stress and strain can lead to displacement of components in known MEMS accelerometers that result in undesirable changes to sensing capacitance.

Proposed solutions to these issues also have significant disadvantages. For example, changes to manufacturing processes and materials to reduce these effects may increase costs and increase package size. Further, proposed solutions are often applicable only to certain types of MEMS accelerometers, i.e., only to MEMS accelerometers with sensing axis in certain planes.

BRIEF SUMMARY

The present disclosure is directed to overcome the problems highlighted previously, and in particular to provide a microelectromechanical sensor device that will have improved stability and reduced drifts of its electrical characteristics in regard to external stimuli, such as thermal variations, or mechanical or environmental stresses, or other external stimuli of various nature.

According to the present solution, a microelectromechanical sensor device is consequently provided. The MEMS sensor device may include a single monolithic anchor structure.

BRIEF DESCRIPTION OF THE SEVERAL VIEWS OF THE DRAWINGS

The present disclosure will be more fully understood by reference to the following figures, which are for illustrative purposes only. These non-limiting and non-exhaustive embodiments are described with reference to the following drawings, wherein like labels refer to like parts throughout the various views unless otherwise specified. The sizes and relative positions of elements in the drawings are not necessarily drawn to scale in some figures. For example, the shapes of various elements are selected, enlarged, and positioned to improve drawing legibility. In other figures, the sizes and relative positions of elements in the drawings are exactly to scale. The particular shapes of the elements as drawn may have been selected for ease of recognition in the drawings. The figures do not describe every aspect of the teachings disclosed herein and do not limit the scope of the claims.

DETAILED DESCRIPTION

In general, the detection structure of a MEMS accelerometer comprises at least one inertial mass, defined customarily as "rotor mass" or simply "rotor," in so far as it is mobile by the inertial effect (without this implying, however, that the inertial mass necessarily has a rotary movement) in the presence of an acceleration to be detected, and moreover mobile electrodes (or rotor electrodes) fixedly coupled thereto.

The inertial mass is arranged suspended above a substrate, coupled to a corresponding rotor anchorage (fixed with respect to the substrate) by elastic elements, which enable movement thereof by the inertial effect in one or more sensing directions.

The detection structure of the MEMS accelerometer further comprises stator electrodes, which are fixedly coupled to the substrate by respective stator anchorages and are capacitively coupled to the rotor electrodes to form one or more sensing capacitors, a capacitive variation of which is indicative of the quantity to be detected.

In particular, in the detection structure, the rotor and stator anchorages have a dual function, of mechanical anchorage with respect to the substrate and moreover of electrical coupling for biasing the corresponding rotor and stator electrodes and detecting the capacitive-variation signal.

The MEMS accelerometer further comprises an ASIC (Application-Specific Integrated Circuit) electronic reading circuit, electrically coupled to the detection structure, which receives at its input the capacitive variation produced by the sensing capacitor and processes it so as to determine the value of the acceleration for generation of an electrical output signal (which can be supplied at the output from the MEMS accelerometer for subsequent processing operations).

The aforesaid ASIC electronic reading circuit and the detection structure are typically provided in respective dies of semiconductor material, which are enclosed within a container, or "package." The package protects the dies and provides an electrical connection interface with the outside world; in so-called substrate-level-package solutions, the package is provided by one or more base and cap layers, which are directly coupled to the dies of the MEMS device, constituting the mechanical and electrical interface thereof towards the outside world.

Figure 1:
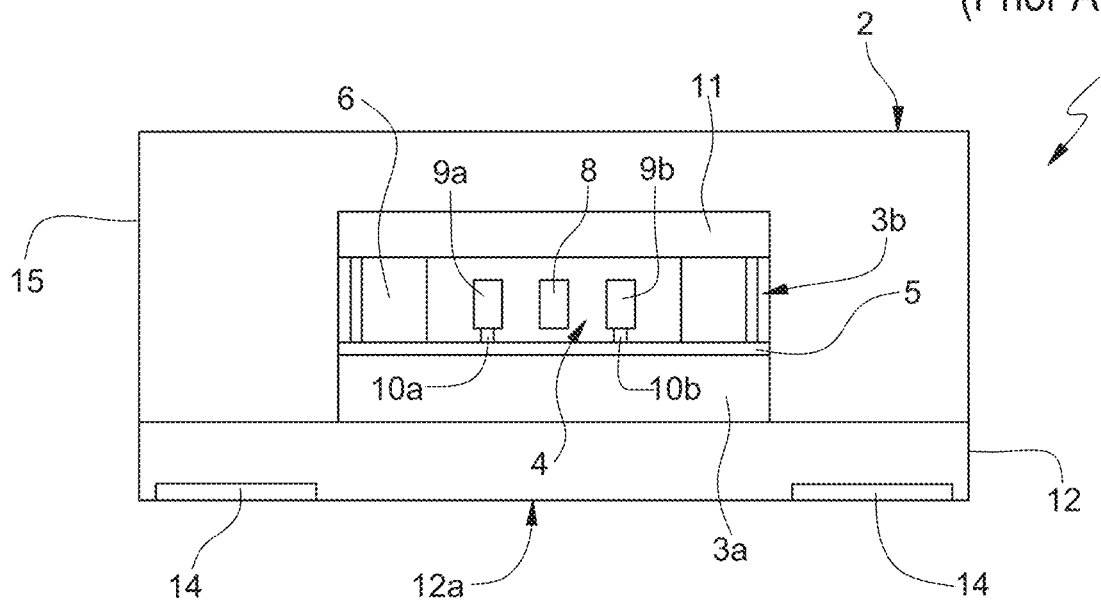
FIG. 1 is a schematic cross-sectional view of a MEMS sensor device and of a corresponding package.

FIG. 1 is a schematic depiction of a MEMS accelerometer 1, comprising a package 2, which encloses: a first die 3a, in which the ASIC is provided; a second die 3b, in which the detection structure 4 is provided, including the substrate 5, on which are formed the inertial mass 6, the mobile electrodes 8 coupled thereto, and first and second fixed electrodes 9a, 9b, forming with the mobile electrodes a pair of sensing capacitors, a differential capacitive variation of which is processed by the ASIC to determine the acceleration to be detected. In FIG. 1, the stator anchorages, directly coupled to the substrate 5, are designated by 10a and 10b. The second die 3b is set stacked on the first die 3a; moreover, a cap 11 is set on top of the stacked arrangement of the first and second dies 3a, 3b.

The package 1 further comprises: a base layer 12, which supports the aforesaid stacked arrangement of the first and second dies 3a, 3b and of the cap 11, and has an outer surface 12a, which constitutes an outer surface of the package 1 and carries electrical-connection elements to the outside world, for example in the form of electrical-connection pads 14; and a coating region 15, for example an epoxy coating, which surrounds the aforesaid stacked arrangement of the first and second dies 3a, 3b and of the cap 10, and defines external lateral and top surfaces of the same package 1, which are designed to contact the external environment.

The previously described detection structure may be subject to even significant measurement errors in the case where stresses and strains arise, in particular induced in the corresponding detection structure as a result of interaction with the package, for example as the temperature or environmental conditions vary or on account of mechanical stresses.

In particular, the package of a microelectromechanical sensor is subject to stress as the temperature varies due to the different thermal expansion coefficients and to the different values of Young's or elastic modulus of the different materials of which it is made, possibly causing corresponding stress in the substrate of the detection structure. Similar strains may occur due to ageing of the materials, or of particular stresses induced from outside, for example during soldering of the package on a printed circuit, or due to absorption of moisture by the materials constituting the package.

Figure 2A:
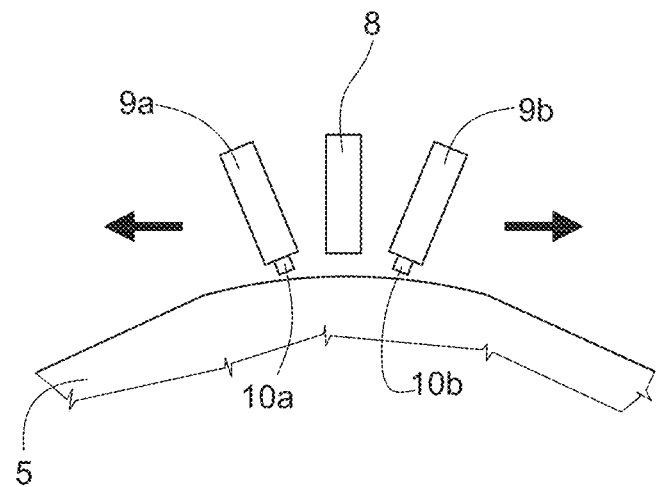
FIGS. 2A-2B are schematic diagrams relating to the detection structure of the MEMS sensor device in the presence of a first deformation of a corresponding substrate.

As shown schematically in FIG. 2A, a swelling may occur at the top surface 5a of the substrate 5 (FIG. 2A exaggerates this deformation for clarity) in the presence of deformations in the substrate 5, such as those caused by a thermal stress due to a positive temperature gradient ($\Delta T>0$). The swelling may lead the fixed electrodes 9a, 9b to move away from the corresponding mobile electrodes 8 relative to an initial resting condition without external acceleration. The corresponding stator anchorages 10a, 10b in fact undergo a relative displacement with respect to the rotor anchorage (here not illustrated).

Figure 2B:
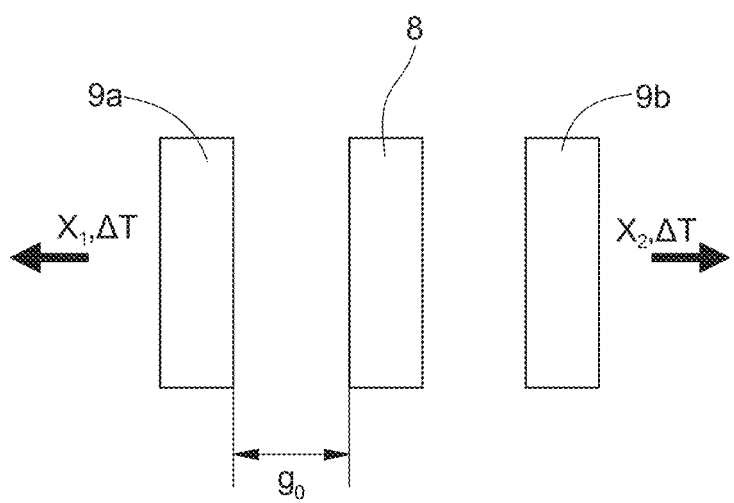

In particular, in FIG. 2B, the distance at rest and in the absence of deformations is designated by $g_0$, and the displacements with respect to the condition at rest due to deformation of the substrate 5 are designated by $X_{1,\Delta T}$ and $X_{2,\Delta T}$ (these displacements are variable as a function of temperature, or in general of all those external effects capable of inducing strains in the substrate 5).

The aforesaid displacements lead to the following variations in the values of the sensing capacitances, denoted by $C_1$, $C_2$, which may be undesirable, in so far as they are not associated to the acceleration to be detected:

$$C_{1,\Delta T} = \frac{\varepsilon_0 \cdot A}{g_0 + x_{1,\Delta T}}$$

$$C_{2,\Delta T} = \frac{\varepsilon_0 \cdot A}{g_0 + x_{2,\Delta T}}$$

Figure 3A:
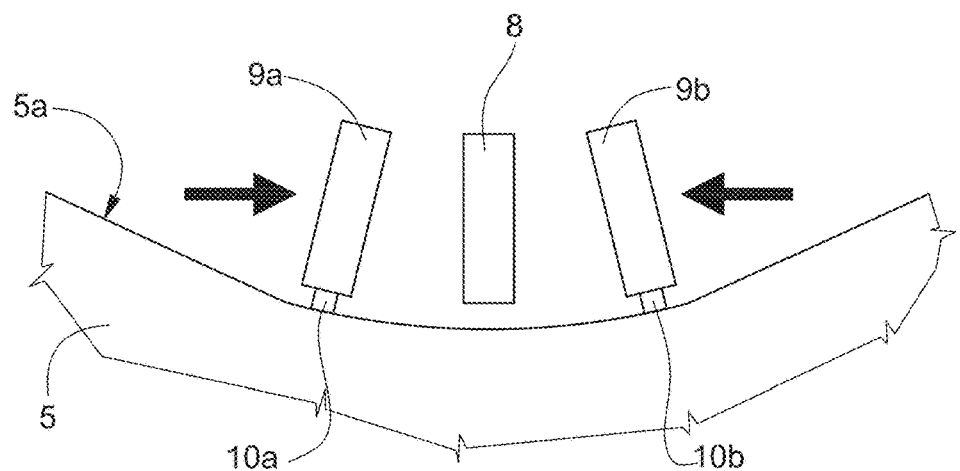
FIGS. 3A-3B are schematic diagrams relating to the detection structure of the MEMS sensor device in the presence of a second deformation of a corresponding substrate.
Figure 3B:
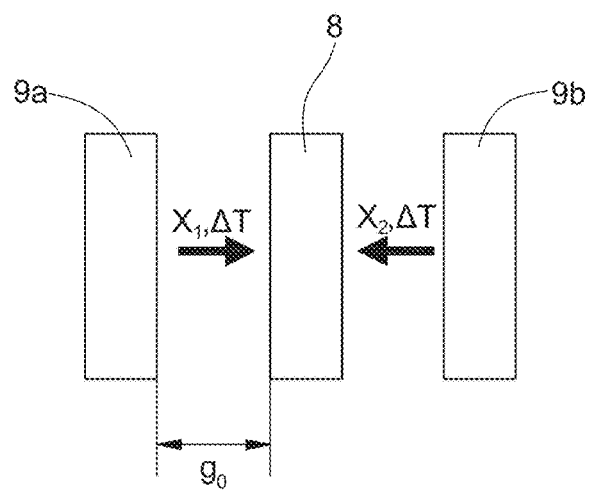

Likewise, with reference to FIGS. 3A and 3B, a negative temperature gradient ($\Delta T<0$) can result in a depression of the top surface 5a of the substrate 5. The depression of the top surface 5a leads to the following variations of the values of the sensing capacitances $C_1$, $C_2$. The following variations are due to the fixed electrodes 9a, 9b approaching the corresponding mobile electrode 8 with respect to the initial condition at rest:

$$C_{1,\Delta T} = \frac{\varepsilon_0 \cdot A}{g_0 - x_{1,\Delta T}}$$

$$C_{2,\Delta T} = \frac{\varepsilon_0 \cdot A}{g_0 - x_{2,\Delta T}}$$

The above capacitive variations therefore cause an undesirable modification (the so-called drift or offset) of the output signal at rest supplied by the MEMS accelerometer, referred to as "zero-g level," and a consequent error in the acceleration detection.

Several solutions have been proposed to minimize these capacitance variations. Some solutions envisage optimization of the acceleration-detection structure. For instance, US 2011/0023604 discloses a detection structure, in which positioning of the rotor and stator anchorages is optimized in order to reduce the variations of the electrical parameters due to the deformations of the substrate. In particular, the rotor and stator anchorages are arranged in strict mutual proximity, i.e., as close as possible to one another compatibly with the manufacturing process.

However, this solution, although advantageous, relates only to a z-axis accelerometer, of a vertical type, i.e., designed for detection of accelerations orthogonal to the horizontal plane of main extension of the corresponding rotor mass and thus has limited applicability. Furthermore, as it has been mentioned, in this solution there are physical limits (linked to the size of the anchorages) and moreover technical limits (linked to the manufacturing technique) that do not enable effective cancelling-out of the drift errors in the output signal supplied by the MEMS accelerometer (in fact, there is in any case a certain distance, although minimized compatibly with the manufacturing process, between the anchorage positions).

Other solutions envisage an optimization at the package level. For example, the use of a ceramic substrate capable of having a reduced sensitivity to deformations has been proposed. However, these solutions entail greater difficulties in the manufacturing process and in general higher costs. In addition, the size of ceramic packages are generally larger than those of traditional packages of plastic material.

As will be described in detail in what follows, one aspect of the present solution envisages providing the detection structure of the MEMS sensor device so that the mobile electrodes (the so-called rotor electrodes) and the fixed electrodes (the so-called stator electrodes) that are capacitively coupled to define at least one sensing capacitor, are mechanically coupled to the substrate by the same, single (or monolithic), unitary, and continuous mechanical-anchorage structure, which is in turn fixedly coupled to the same substrate. In this way, any possible stress induced by the package in the substrate reflects in an equivalent manner on the mobile and fixed electrodes, rendering detection insensitive to the stress and preventing any possible modifications of the output signal at rest supplied by the MEMS sensor device (the so-called zero-g level drift).

A distinction is consequently made between mechanical anchorages and electrical anchorages of at least some of the structural elements that define the detection structure, in particular of the fixed electrodes, by introducing purposely provided electrical anchorages, distinct from the mechanical anchorages, for biasing the electrodes and detecting the capacitive-variation signal. As will be described in detail, these electrical anchorages are electrically coupled to the single mechanical-anchorage structure so as to define an electrical path for biasing and for detection of the capacitive-variation signal, which represents at the same time an altogether negligible mechanical coupling.

According to an aspect of the present solution, the detection structure comprises two stacked structural layers of semiconductor material (in particular, epitaxial silicon), which are independent of one another and are appropriately processed (in particular, by trench etches and removal of sacrificial layers) to define the structural elements of the detection structure.

As will be described in detail hereinafter, in a first structural layer at least the inertial mass of the detection structure is defined, and in a second structural layer at least connection elements towards the single anchorage structure, in particular for mechanical coupling of the fixed electrodes to the anchorage structure, are defined. Moreover, in the single anchorage structure distinct electrical coupling regions are defined, mechanically fixed with respect to one another but electrically uncoupled so as to enable definition of separate and distinct conductive paths for electrical biasing of the aforesaid fixed electrodes, through the electrical-coupling regions and the aforesaid connection elements.

Manufacturing of the detection structure via the aforesaid stacked structural layers may, for example, be implemented using the process described in detail in Italian patent application 102020000003868, filed in the name of the present Applicant on Feb. 25, 2020.

In brief, this process envisages growth, on a substrate, for example, of monocrystalline silicon, of a first thick epitaxial layer set on a first sacrificial layer, of a dielectric material, which is then partially removed by chemical etching (for example, using hydrofluoric-acid vapours). The first sacrificial layer has openings, in which anchoring regions are defined for anchoring the aforesaid first epitaxial layer to the substrate.

The first epitaxial layer constitutes a first structural layer in which first trenches are formed, for example with a dry chemical silicon etching. The trenches are empty, or subsequently filled with dielectric material, and define structural elements of the detection structure or a bottom part (i.e., closer to the substrate) of the same structural elements. Conductive regions (which define electrical pads and interconnections) are formed underneath the first sacrificial layer, at the anchoring regions to the substrate of the aforesaid first epitaxial layer. The conductive regions are separated from a top surface of the substrate by a dielectric layer and enable electrical biasing of the aforesaid structural elements.

Next, the manufacturing process envisages formation of a second sacrificial layer, of a dielectric material, on the first epitaxial layer and definition of the second sacrificial layer for formation of sacrificial regions separated from one another by openings.

A second epitaxial layer, having for example a thickness less than that of the first epitaxial layer, is then formed on the first epitaxial layer and on the sacrificial regions. The second epitaxial layer is in direct contact with the first epitaxial layer at the aforesaid openings and constitutes a second structural layer in which the structural elements of the detection structure or a top part (i.e., a part further away from the substrate) of the structural elements are in part defined via formation of second trenches.

The process then envisages partial or complete removal of the sacrificial regions, once again by chemical etching (for example, using hydrofluoric-acid vapours) so as to release the structural elements of the detection structure.

It is noted that, following etching, regions of the second epitaxial layer may be in direct (mechanical and electrical) contact with underlying regions of the first epitaxial layer, or else may be separated by an empty region or gap from the underlying first epitaxial layer so as to be suspended above the first epitaxial layer, or may be separated from the first epitaxial layer by dielectric regions remaining after etching of the second sacrificial layer.

The process typically comprises final steps that include coupling of a cap through a bonding layer (for example, of glass frit) on the stack of the first and second structural layers of the detection structure. This cap has a sealing function, including hermetic sealing, and has the purpose of protecting the detection structure with respect to the external environment (from moisture, dust, etc.), as well as from impact.

Figure 4:
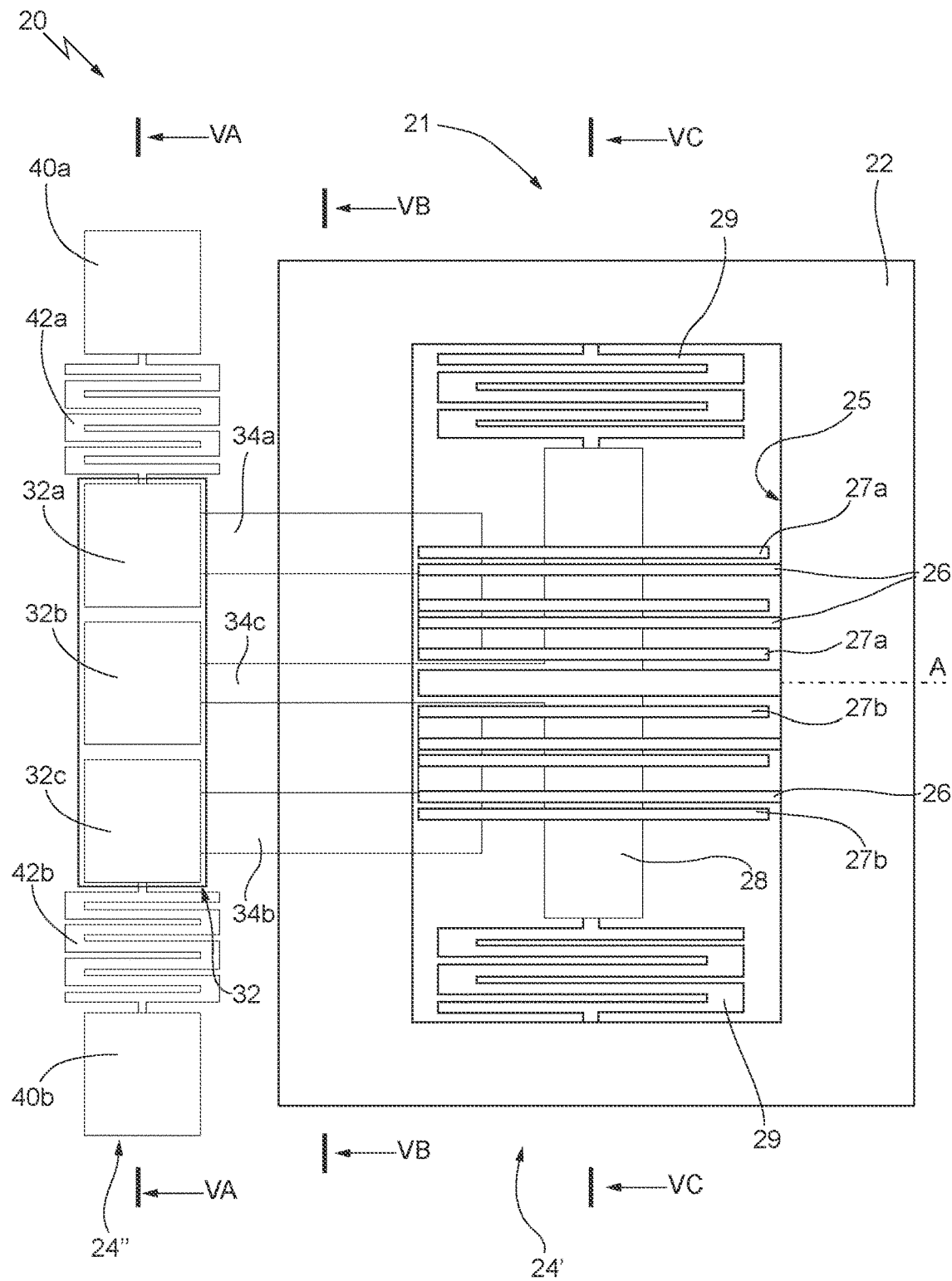
FIG. 4 is a schematic plan view of a detection structure of a MEMS sensor device, according to a first embodiment of the present solution.
Figure 5A:
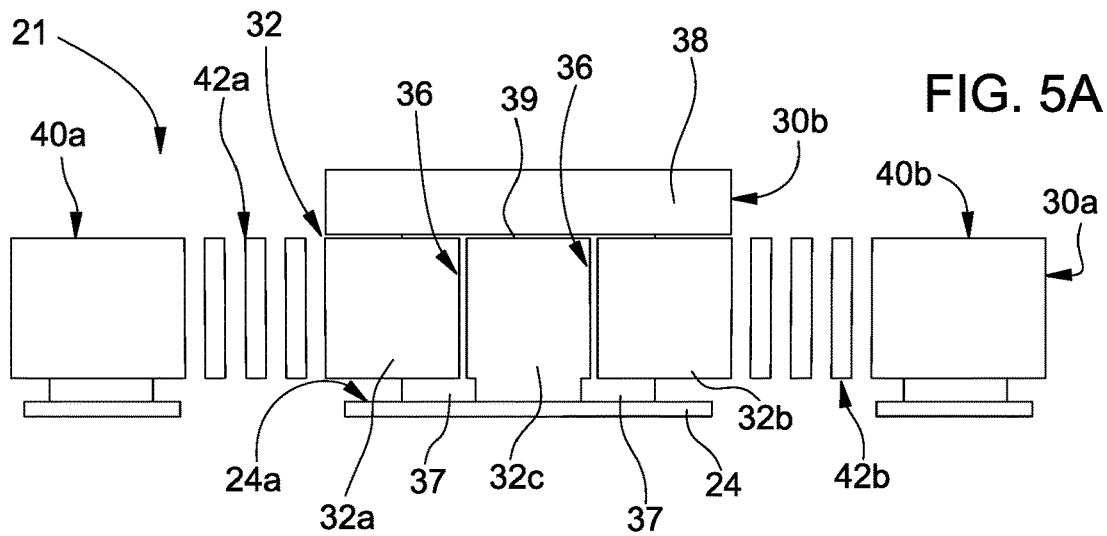
FIGS. 5A-5C are cross-sectional views of the MEMS sensor device of FIG. 4 along lines VA, VB, and VC, respectively, in FIG. 4.
Figure 5B:
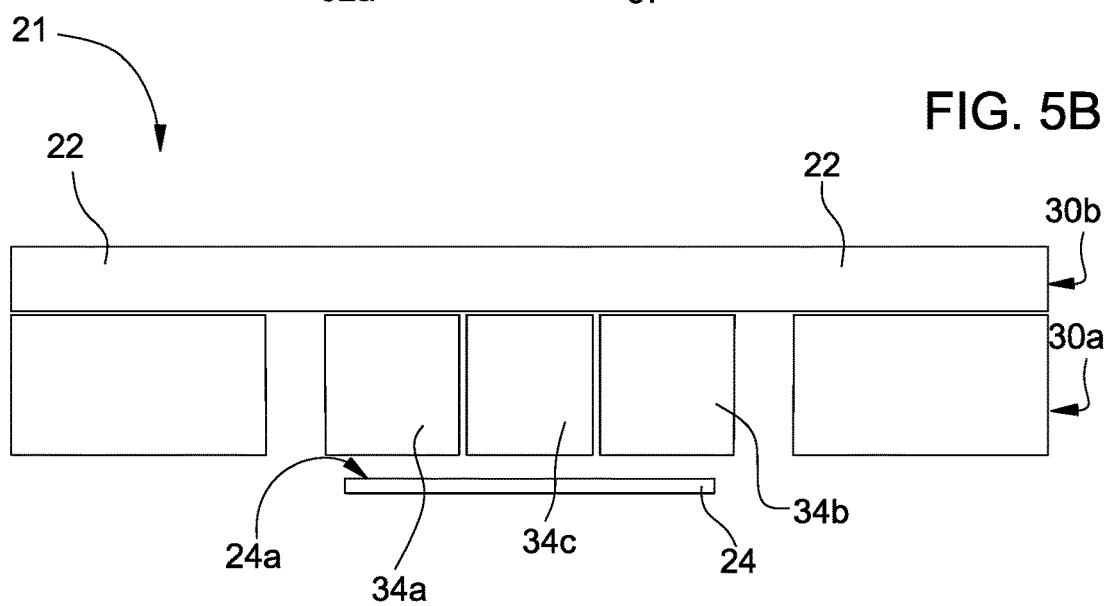
Figure 5C:
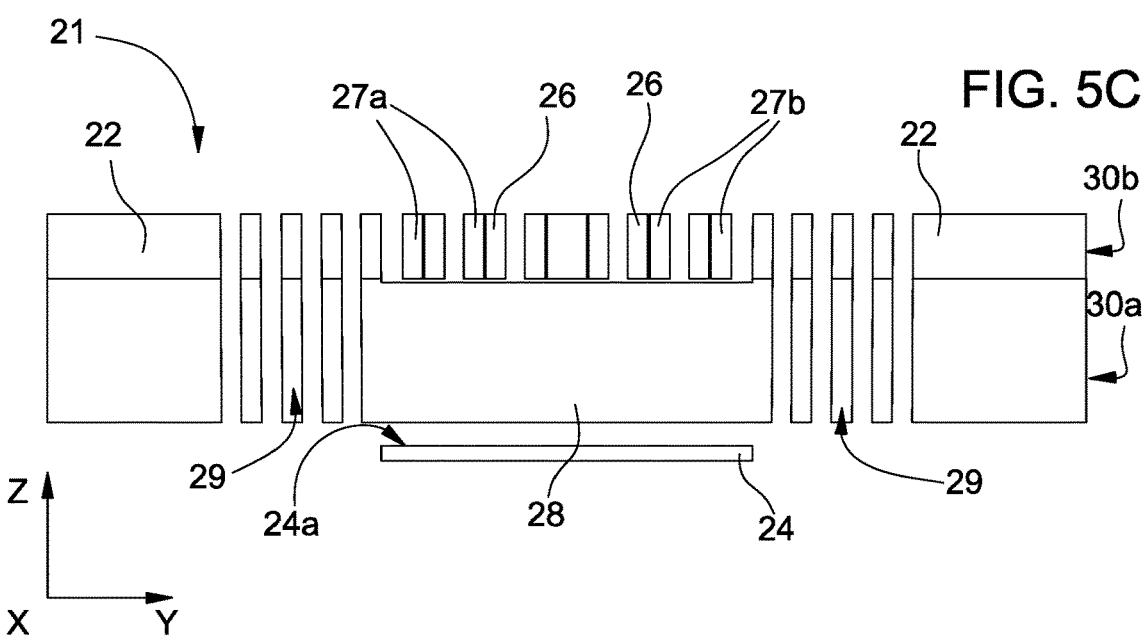

With reference to the plan view of FIG. 4 and to the subsequent sectional views of FIGS. 5A-5C, one or more embodiments of the present solution are now described referring to a sensor device 20 that is a uniaxial accelerometer in a horizontal plane XY.

The detection structure 21 of the sensor device 20 includes an inertial mass 22 that is arranged suspended above a substrate 24 of semiconductor material, in particular silicon. The inertial mass has the shape of a frame in the horizontal plane XY, i.e., the plane that is parallel to a top surface 24a of the substrate 24 and constitutes the plane of main extension of the same inertial mass 22.

The detection structure 21 has a central axis of symmetry A parallel to a first horizontal axis X of the horizontal plane XY, and the frame of the inertial mass 22 extends along a second horizontal axis Y of the horizontal plane XY, orthogonal to the first horizontal axis x.

As will be also highlighted hereinafter, the sensor device 20 senses acceleration along the second horizontal axis Y with the inertial mass 22 being mobile along the second horizontal axis Y in response to the acceleration to be detected.

A window 25 is defined inside the frame of the inertial mass 22. Mobile electrodes 26 and fixed electrodes 27a, 27b are arranged in the window 25, with plane and parallel faces and in interdigitated configuration.

The mobile electrodes 26 are fixedly coupled to the inertial mass 22 and have a main extension along the first horizontal axis X of the horizontal plane XY. The window 25 is divided in the horizontal plane XY into two halves by the central axis of symmetry A. The first fixed electrodes 27a are arranged in a top half of the two halves of the window 25 and the second fixed electrodes 27b are arranged in a bottom half of the two halves of the window 25. The first and second fixed electrodes 27a, 27b are arranged on opposite sides of, and facing a respective mobile electrode 26 along the second horizontal axis Y. The fixed electrodes 27a, 27b and the mobile electrode 26 form a pair of sensing capacitors, which undergo opposite capacitive variations in response to movement of the inertial mass 22 along the second horizontal axis Y (so as to provide a differential-detection scheme).

The detection structure 21 further comprises a rotor-supporting element 28 inside the window 25. In some embodiments, the rotor-support element 28 is positioned centrally in the window 25 and extends along the second horizontal axis Y. The inertial mass 22 is coupled to the rotor-supporting element 28 by elastic-coupling elements 29, which may have a folded configuration. The elastic-coupling elements 29 are compliant to movement along the second horizontal axis Y (therefore enabling the movement of detection of the inertial mass 22) and rigid to other movements in the horizontal plane xy and in a direction transverse to the same horizontal plane xy, in particular along a vertical axis Z, orthogonal to the horizontal plane xy.

According to one or more embodiments, the inertial mass 22, the mobile electrodes 26, and the fixed electrodes 27a, 27b are provided in a second structural layer 30b (in particular, of epitaxial silicon) of the detection structure 21 that is at a higher level and further away from the top surface 24a of the substrate 24, whereas the rotor-supporting element 28 is provided in a first structural layer 30a (in particular, once again of epitaxial silicon) of the same detection structure 21 that is at a lower level and closer to the top surface 24a of the substrate 24.

Furthermore, in the illustrated embodiment, the inertial mass 22 has, along its perimeter (in a non-continuous manner) a reinforcement structure, fixed with respect to the inertial mass 22 and constituting itself part of the inertial mass 22 that is provided in the first structural layer 30a The elastic-coupling elements 29 are obtained by defining both the first structural layer 30a and the second structural layer 30b.

The detection structure 21 further comprises a single anchorage structure 32 that mechanically anchors the inertial mass 22 and the corresponding mobile electrodes 26 and the fixed electrodes 27a, 27b to the same area of the substrate 24.

In particular, the aforesaid inertial mass 22 (which encloses within it, in the window 25, the mobile electrodes 26 and the fixed electrodes 27a, 27b) is positioned at a first area 24' of the top surface 24a of the substrate 24, whereas the single anchorage structure 32 is positioned at a second area 24" of the top surface 24a of the substrate 24. The second area 24" is positioned externally to the first area 24' and is spaced from the first area 24' at a selected distance.

The detection structure 21 further includes a first connection element 34a and a second connection element 34b for mechanically coupling the first and second fixed electrodes 27a, 27b to the single anchorage structure 32, respectively. The detection structure 21 includes a third connection element 34c for mechanically coupling the rotor-supporting element 28 to the aforesaid single anchorage structure 32 such that the fixed electrodes 27a, 27b and the rotor-supporting element 28 are anchored to the substrate 24 in the same area of the substrate 24.

The connection elements 34a-34c are provided in the first structural layer 30a of the detection structure 21, which is at the lower level and positioned closer to the top surface 24a of the substrate 24, so as to "straddle" the frame of the inertial mass 22 (which is provided, instead, at the higher level and further from the top surface 24a of the substrate 24) and reach the anchorage structure 32. It is noted that the connection elements 34a-34c pass under the inertial mass 22, where the inertial mass 22 does not have the reinforcement structure provided in the first structural layer 30a, as shown in FIG. 5B).

In greater detail, and with specific reference to FIG. 5A, distinct electrical coupling regions are defined in the single anchorage structure 32 that are mechanically fixed with respect to one another but electrically uncoupled by trench insulation regions 36 filled with dielectric material. The electrical coupling regions include a first coupling region 32a and a second coupling region 32b that are fixedly coupled to the first connection element 34a and to the second connection element 34b, respectively, and a third coupling region 32c that is fixedly coupled to the third connection element 34c. In the embodiment illustrated, the aforesaid coupling regions 32a-32c are defined in the first structural layer 30a of the detection structure 21 at a lower level and closer to the top surface 24a of the substrate 24.

In greater detail, the third coupling region 32c is arranged centrally with respect to the single anchorage structure 32, and the aforesaid first and second coupling regions 32a, 32b are arranged externally to the third coupling region 32c, on opposite sides of the third coupling region 32c along the second horizontal axis Y.

The third coupling region 32c is directly connected (by a connection portion of epitaxial silicon) to an underlying conductive pad or path (here not illustrated) formed on the surface 24a of the substrate 24. The first and second coupling regions 32a, 32b are separated from the same top surface 24a of the substrate 24 by respective dielectric regions 37 (which remain after removal of the sacrificial layer underlying the aforesaid first structural layer during the manufacturing process).

The aforesaid single anchorage structure 32 further comprises a covering region 38 in the second structural layer 30b of the detection structure 21 that is set on top of the aforesaid coupling regions 32a-32c and separated from the coupling regions 32a-c by a further dielectric region 39.

As illustrated in detail once again in FIG. 5A, the detection structure 21 further comprises a first electrical-anchorage structure 40a and a second electrical-anchorage structure 40b, which are distinct and separated from the single mechanical-anchorage structure 32 along the second horizontal axis y. The first and second electrical-anchorage structures 40a, 40b are electrically coupled to the first coupling region 32a and the second coupling region 32b, respectively, of the same mechanical-anchorage structure 32 through a first electrical-connection element (or electrical wire) 42a, and a second electrical-connection element (or electrical wire) 42b.

In detail, the first and second electrical-anchorage structures 40a, 40b are constituted by portions of the first structural layer 30a of the detection structure 21, which is positioned at the lower level and closer to the top surface 24a of the substrate 24. In the example illustrated, the first and second electrical-anchorage structures 40a, 40b are arranged on opposite sides of the mechanical-anchorage structure 32 along the second horizontal axis Y. The electrical-connection elements 42a, 42b are themselves provided in the aforesaid first structural layer 30a as thin and long portions folded in serpentine fashion and configured so as to constitute an altogether negligible mechanical coupling with the first and second coupling regions 32a, 32b of the mechanical-anchorage structure 32.

The aforesaid portions of the first structural layer 30a that define the first and second electrical-anchorage structures 40a, 40b are directly connected (by a connection portion of epitaxial silicon) to a respective underlying conductive pad or path (here not illustrated) formed on the surface 24a of the substrate 24.

Thus, separate and distinct conductive paths are defined in the detection structure 21 for electrical biasing and detection of the capacitive-variation signal. These paths include: a first conductive path and a second conductive path for electrical connection between the first and second fixed electrodes 27a, 27b (which comprise the aforesaid first and second electrical-anchorage structures 40a, 40b), the first and second electrical-connection elements 42a, 42b, the first and second coupling regions 32a, 32b of the mechanical-anchorage structure 32, and the first and second connection elements 34a, 34b; and a third conductive path for electrical connection between the inertial mass 22 and the coupled mobile electrodes 26 (which comprises the third coupling region 32c of the mechanical-anchorage structure 32) and the third connection element 34c.

Advantageously, the presence of the single anchorage structure 32 enables elimination of the relative displacements between the rotor and the stator as a result of external stresses or stimuli.

Figure 6A:
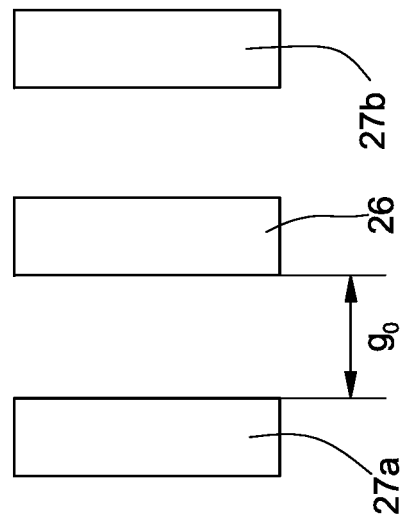
FIGS. 6A-6B are schematic diagrams relating to the detection structure of the MEMS sensor device of FIG. 4 in the presence of a first deformation and, respectively, of a second deformation of a corresponding substrate.
Figure 6A:
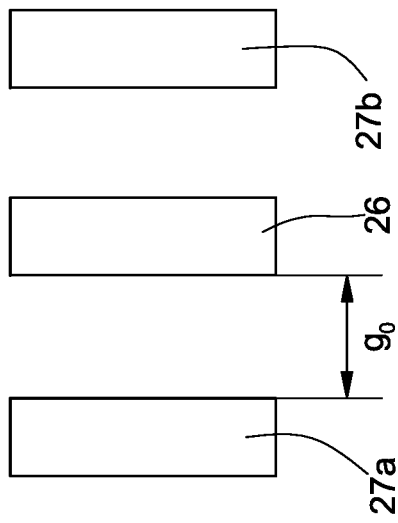
Figure 6A:
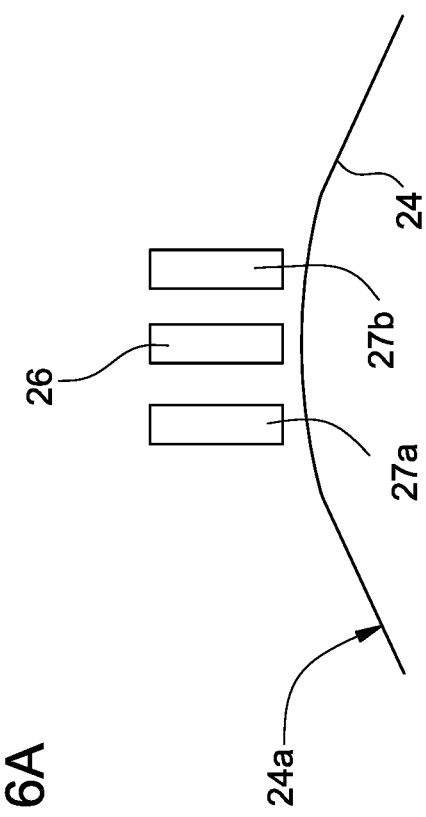
Figure 6B:
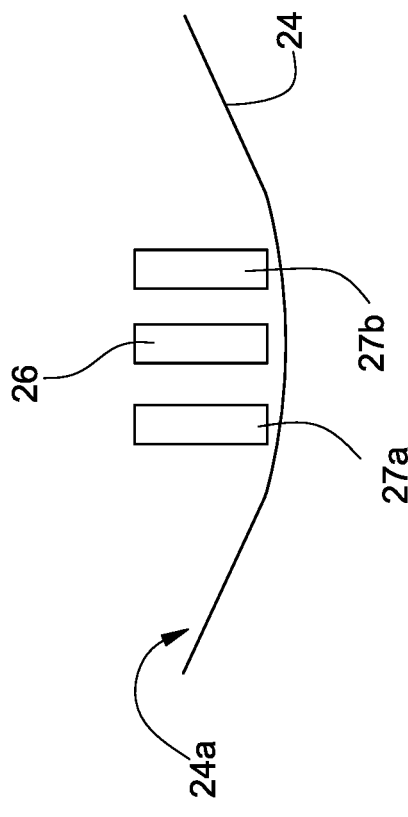

For example, as shown schematically in FIGS. 6A and 6B, even in the presence of deformations of the substrate 24 and top surface 24a of the substrate 24 resulting from a thermal stress due to a positive temperature gradient ($\Delta T>0$, FIG. 6A) or a negative temperature gradient ($\Delta T<0$, FIG. 6B), substantially no relative movement between the mobile electrodes 26 and the fixed electrodes 27a-27b occurs in the rest condition. in the absence of external accelerations (in other words, there is no variation of the gap at rest $g_o$). The aforesaid mobile electrodes 26 and fixed electrodes 27a-27b are in fact forced to move together, in a fixed manner, by virtue of coupling to the single anchorage structure 32.

Therefore, advantageously, undesired modification of the output signal at rest supplied by the MEMS accelerometer does not occur, since there is no change of the zero-g level.

It is moreover emphasised that any possible deformations of the substrate 24 at the first and second electrical-anchorage structures 40a, 40b (with respect to the position of the aforesaid single anchorage structure 32) are completely absorbed elastically by the first and second electrical-connection elements 42a, 42b without affecting the single anchorage structure 32.

One or more embodiments of the present solution are described with reference to the plan view of FIG. 7, which illustrates a sensor device 20 that is a uniaxial accelerometer in the horizontal plane XY (with sensing axis along the second horizontal axis Y).

In FIG. 7, the configuration of the detection structure 21 is substantially equivalent to the one described above, but the detection structure 21 in FIG. 7 is vertically "turned over," or vertically inverted. As such, the inertial mass 22, the mobile electrodes 26, the fixed electrodes 27a, 27b, and the elastic suspension elements 29 are in the first structural layer 30a and the rotor-supporting element 28 and the connection elements 34a-34c are in the second structural layer 30b of the detection structure 21 so as to "straddle" the frame of the inertial mass 22 and reach the single anchorage structure 32.

Figure 8:
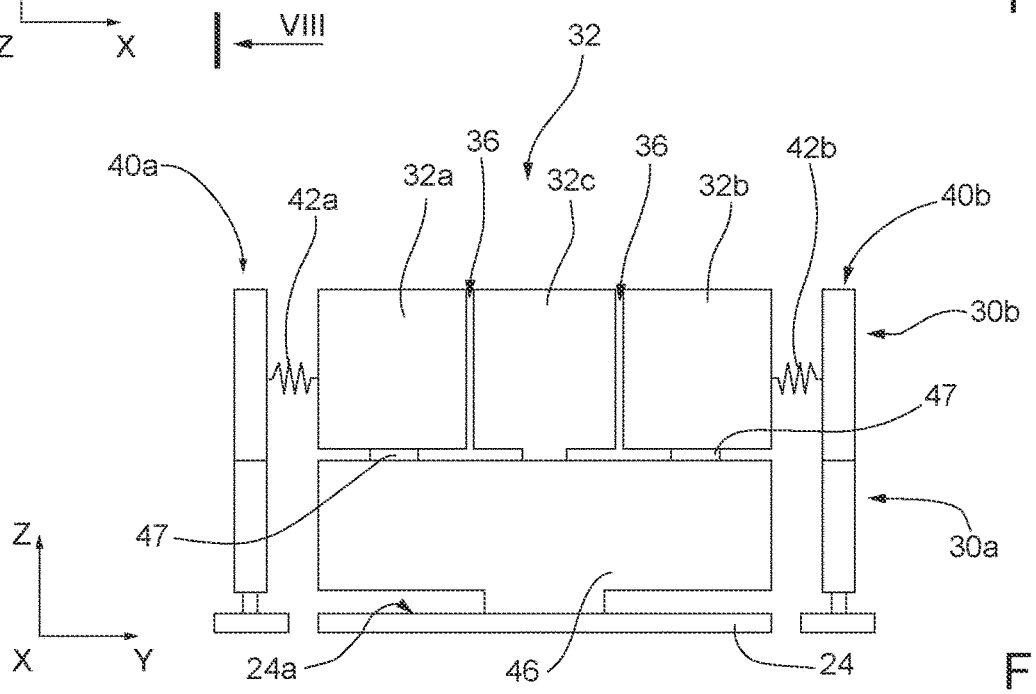
FIG. 8 is a cross-sectional view of an anchorage structure of the MEMS sensor device of FIG. 7.

In some embodiments, the configuration of the single anchorage structure 32 changes, as illustrated in the cross-sectional view of FIG. 8 (where the electrical-connection elements 42a, 42b are represented schematically for sake of simplicity).

In particular, the coupling regions 32a-32c are provided in the second structural layer 30b and are separated from one another by the trench insulation regions 36, which may be empty, i.e., without dielectric filler material.

A monolithic anchorage portion 46 constituted by full epitaxial silicon is defined in the first structural layer 30a of the detection structure 21. The monolithic anchorage portion 46 is directly coupled (by a connection portion of epitaxial silicon) to an underlying conductive pad or path (here not illustrated) formed on the surface 24a of the substrate 24.

The first and second coupling regions 32a, 32b are coupled to the aforesaid monolithic anchorage portion 46 via respective dielectric regions 47, whereas the third coupling region 32c is directly connected (by a connection portion of epitaxial silicon) to the same monolithic anchorage portion 46.

In this embodiment, the first and second electrical-anchorage structures 40a, 40b are stacked portions of the first and second structural layers 30a, 30b of the detection structure 21. The electrical-connection elements 42a, 42b are provided in the second structural layer 30b and are configured so as to constitute a negligible mechanical coupling with the first and second coupling regions 32a, 32b of the mechanical-anchorage structure 32.

Figure 7:
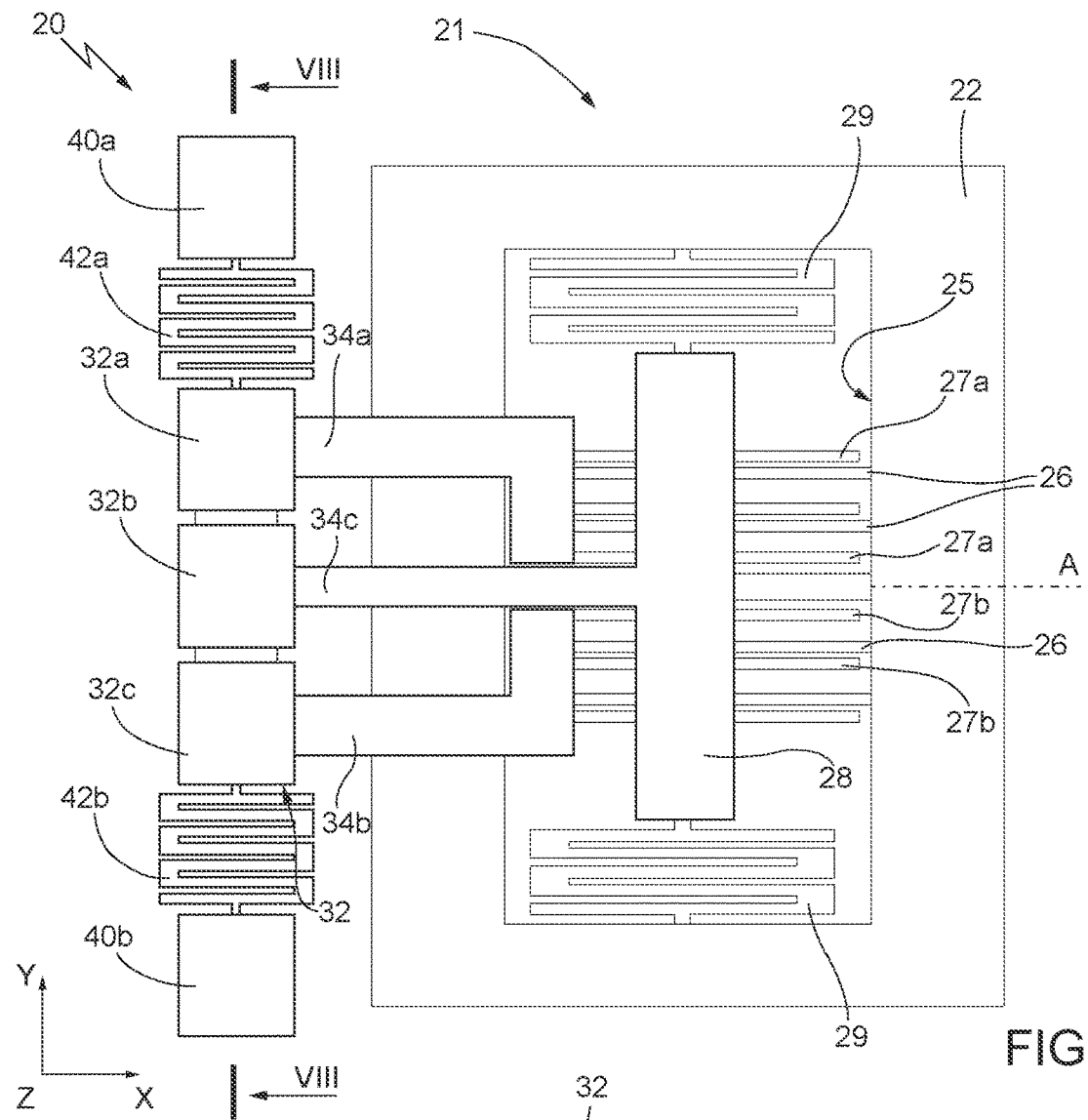
FIG. 7 is a schematic plan view of a detection structure of a MEMS sensor device, according to a second embodiment of the present solution.

The single mechanical-anchorage structure 32 in FIG. 7 and FIG. 8 is connected to the substrate 24 by a monolithic portion of silicon (the monolithic anchorage portion 46) with a single coefficient of thermal expansion and other consistent material properties and characteristics throughout the anchorage portion 46. As such, the anchorage portion 46 in FIG. 7 and FIG. 8 reduces or eliminates possible second-order effects represented by the different coefficients of thermal expansion of silicon and of the dielectric material (silicon oxide), leading to an even higher rejection of the external stimuli and reducing changes in sensing capacitance.

Figure 9:
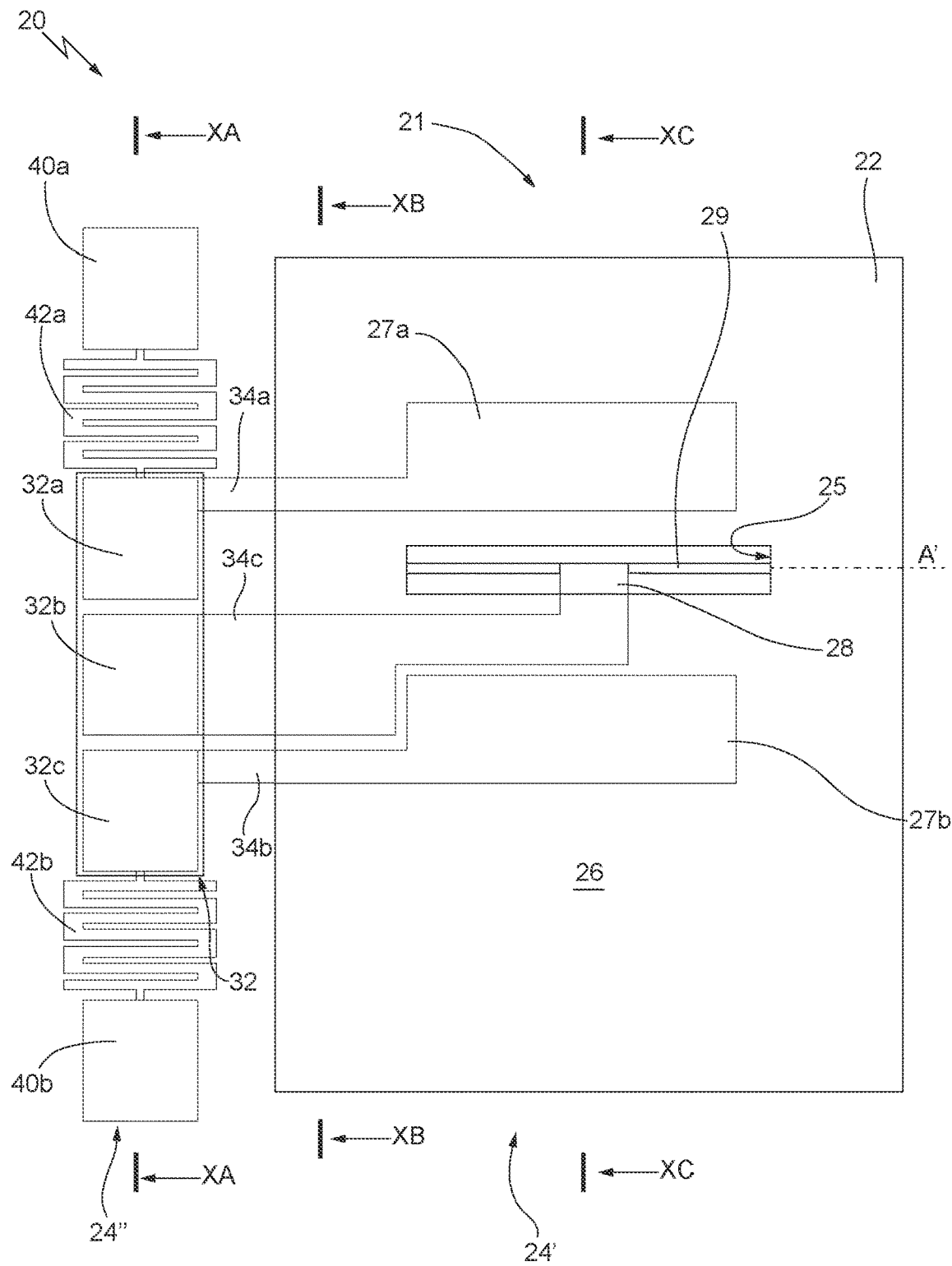
FIG. 9 is a schematic plan view of a detection structure of a MEMS sensor device, according to a third embodiment of the present solution.
Figure 10A:
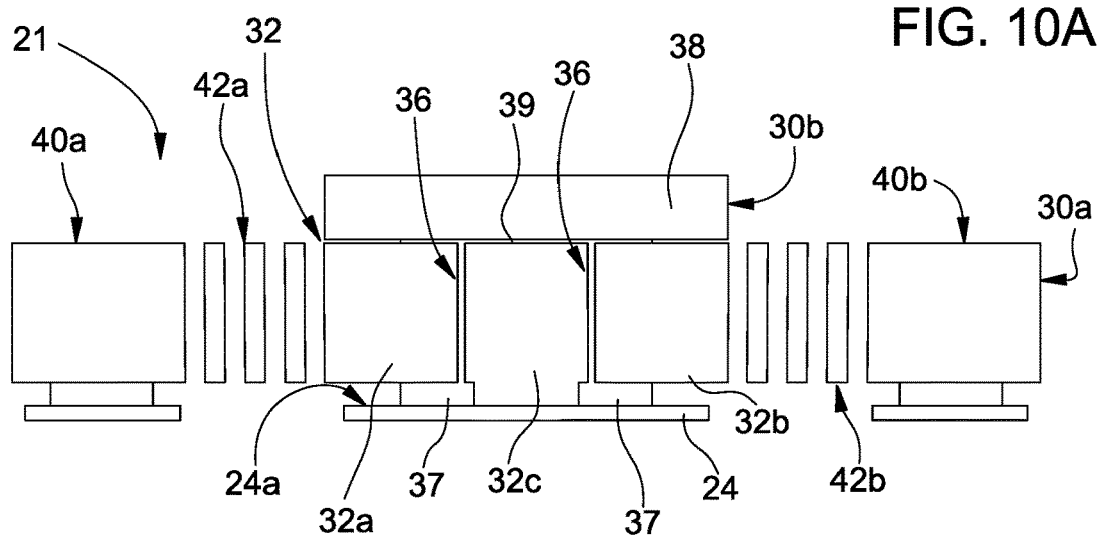
FIGS. 10A-10C are cross-sectional views, along respective lines of section, of the MEMS sensor device of FIG. 9.
Figure 10B:
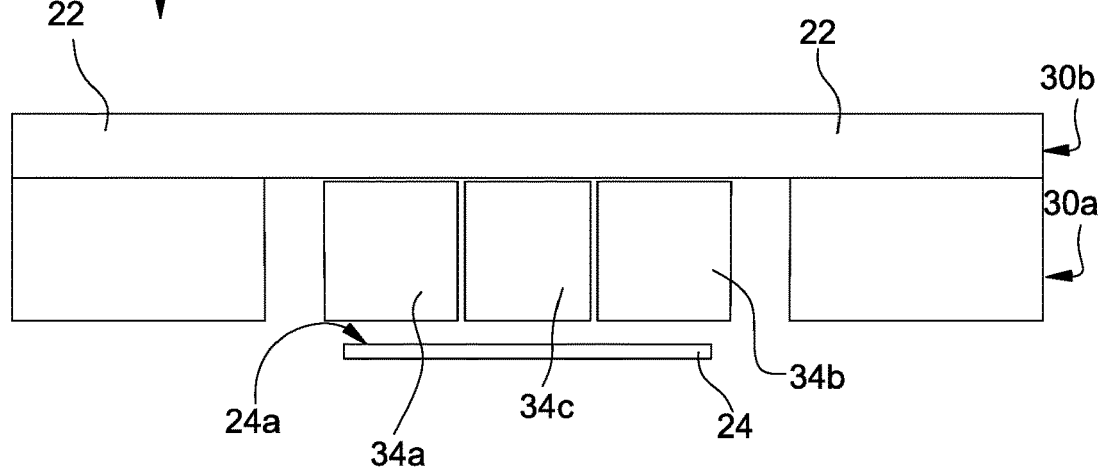
Figure 10C:
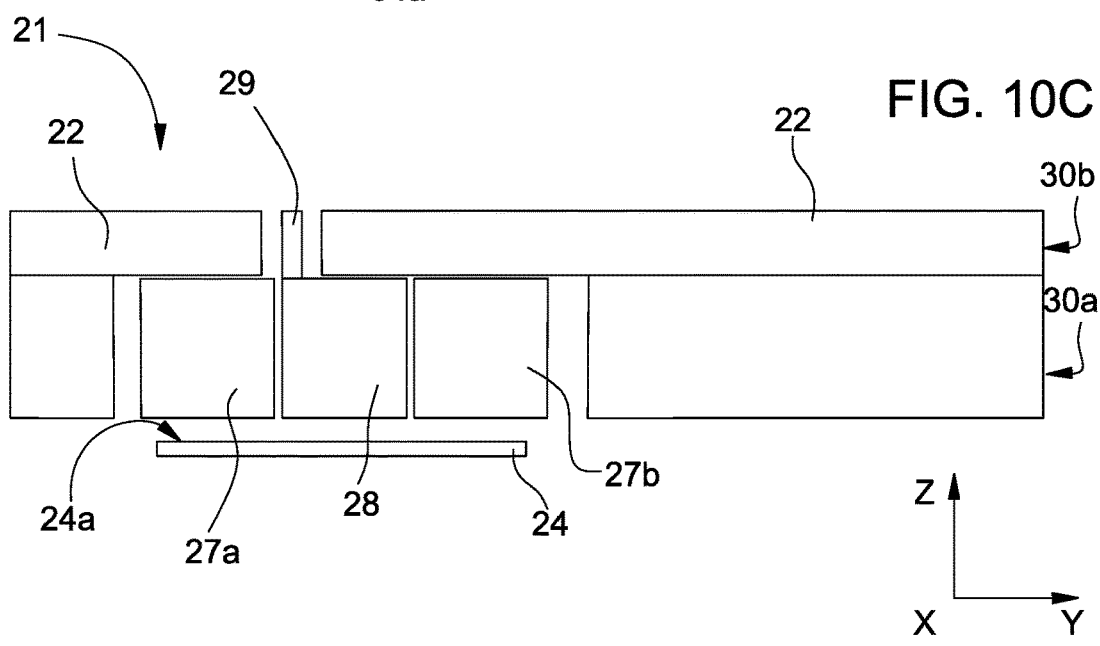

With reference to the plan view of FIG. 9 and the subsequent cross-sectional views of FIGS. 10A-10C, a third embodiment includes a sensor device 20 that is a uniaxial accelerometer for detection of vertical accelerations along the vertical axis Z, orthogonal to the horizontal plane XY.

As will be clear from an examination of the aforesaid FIGS. 9 and 10A-10C, the single mechanical-anchorage structure 32 is similar to other embodiments described herein, except for the configuration of the inertial mass 22 and of the mobile and fixed electrodes of the detection structure for implementation of the detection of vertical acceleration.

More specifically, the inertial mass 22 has a substantially rectangular shape in the horizontal plane XY with a main extension along the second horizontal axis Y. The window 25 in this case has reduced dimensions and divides the inertial mass 22 into two portions, one having a greater extension and one having a smaller extension along the second horizontal axis Y.

The elastic-coupling elements 29 are located within the window 25 and are linear and aligned along an axis of rotation A' parallel to the first horizontal axis X. The elastic-coupling elements 29 are coupled at the center to the rotor-supporting element 28, which is set centrally in the same window 25, but underneath the inertial mass 22 and suspended above the substrate 24.

The aforesaid elastic-coupling elements 29 are, in this case, compliant to a torsional movement about the axis of rotation A' and rigid with respect to linear movements in the horizontal plane XY or outside the horizontal plane XY so as to enable the movement of the inertial mass 22 about the same axis of rotation A'.

A first fixed electrode and a second fixed electrode (or stator electrodes) 27a, 27b are located underneath the inertial mass 22, and, in particular, underneath the first and second portions of the inertial mass 22 defined by the window 25. The first and second fixed electrodes have a substantially rectangular shape in the horizontal plane XY and are suspended above the top surface 24a of the substrate 24.

The inertial mass 22 includes a mobile electrode 26 of the detection structure 21, capacitively coupled in the direction of the vertical axis Z to the underlying fixed electrodes 27a, 27b so as to form two sensing capacitors with differential variations. Rotation of the inertial mass 22 about the axis of rotation A' causes the inertial mass 22 to approach one of the two fixed electrodes 27a, 27b and correspondingly to move away from the other one of the fixed electrodes 27a, 27b.

In some embodiments, the first and second connection elements 34a, 34b are present for mechanically coupling the first fixed electrode 27a and the second fixed electrode 27b to the single anchorage structure 32, respectively. Moreover, the third connection element 34c mechanically couples the rotor-supporting element 28 to the same single anchorage structure 32.

In this embodiment, the inertial mass 22 is provided in the second structural layer 30b of the detection structure 21, at a higher level and further away from the top surface 24a of the substrate 24 (the reinforcement structure being once again formed fixedly, in a non-continuous way along its perimeter, in the first structural layer 30a), whereas the first and second fixed electrodes 27a, 27b, the rotor-supporting element 28, and the connection elements 34a-34c are provided in the first structural layer 30a of the same detection structure 21 and at a lower level and closer to the top surface 24a of the substrate 24.

It is to be appreciated that further embodiments may include variations or modifications to the vertical accelerometer configuration FIGS. 9 and 10A-10C similar to those described with reference to FIGS. 7 and 8.

Figure 11:
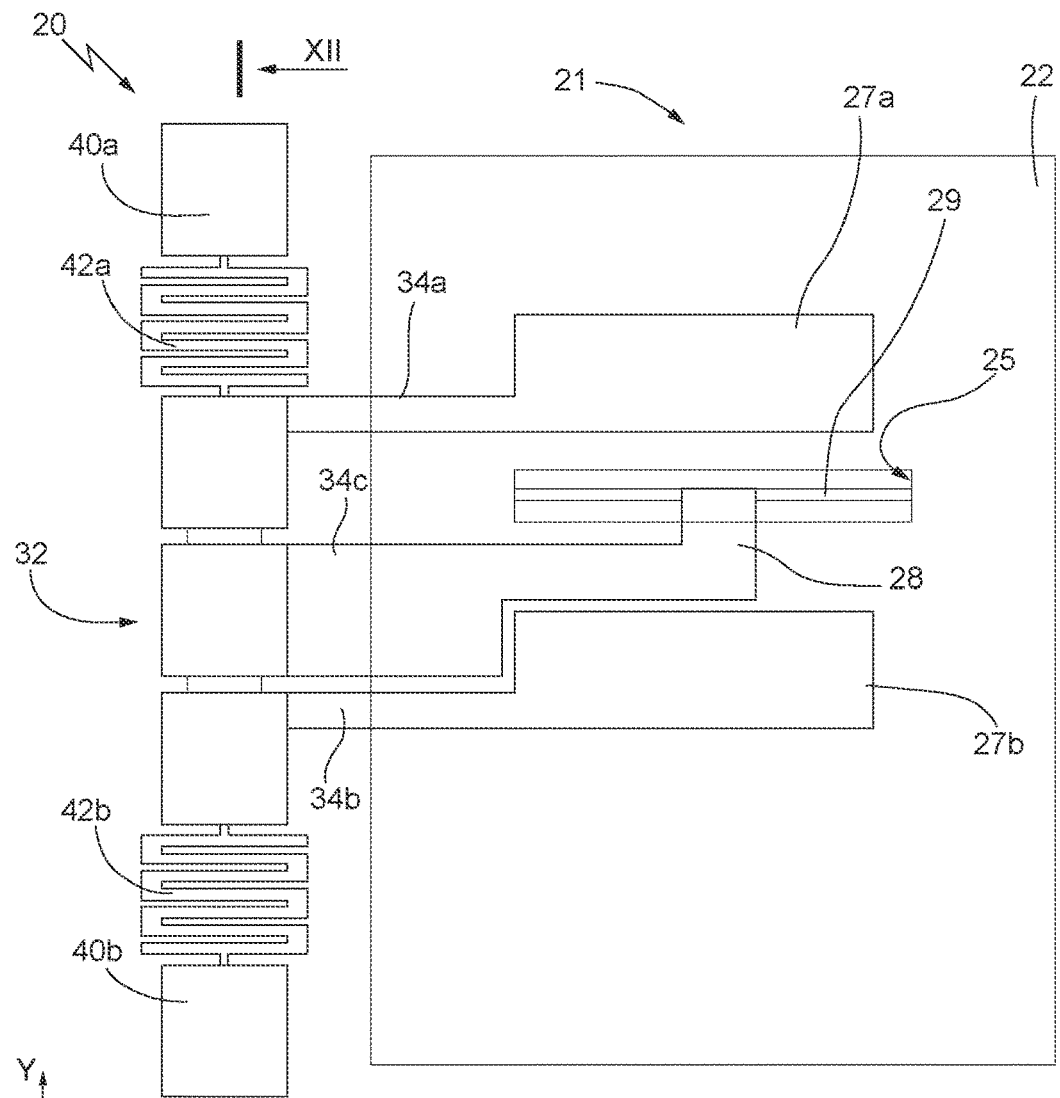
FIG. 11 is a schematic plan view of a detection structure of a MEMS sensor device, according to a fourth embodiment of the present solution.

In particular, a fourth embodiment of the present solution is illustrated in the plan view of FIG. 11, which illustrates a sensor device 20 that is a uniaxial accelerometer along the vertical axis Z.

As will be clear from FIG. 11, the configuration of the detection structure 21 is substantially equivalent to the one described previously with reference to FIGS. 9 and 10A-C, but "turned upside down," or inverted with the inertial mass 22 provided mainly in the first structural layer 30a of the detection structure 21 and at a lower level and closer to the top surface 24a of the substrate 24 and with the first and second fixed electrodes 27a, 27b, the rotor-supporting element 28, and the connection elements 34a-34c provided in the second structural layer 30b of the same detection structure 21.

Figure 12:
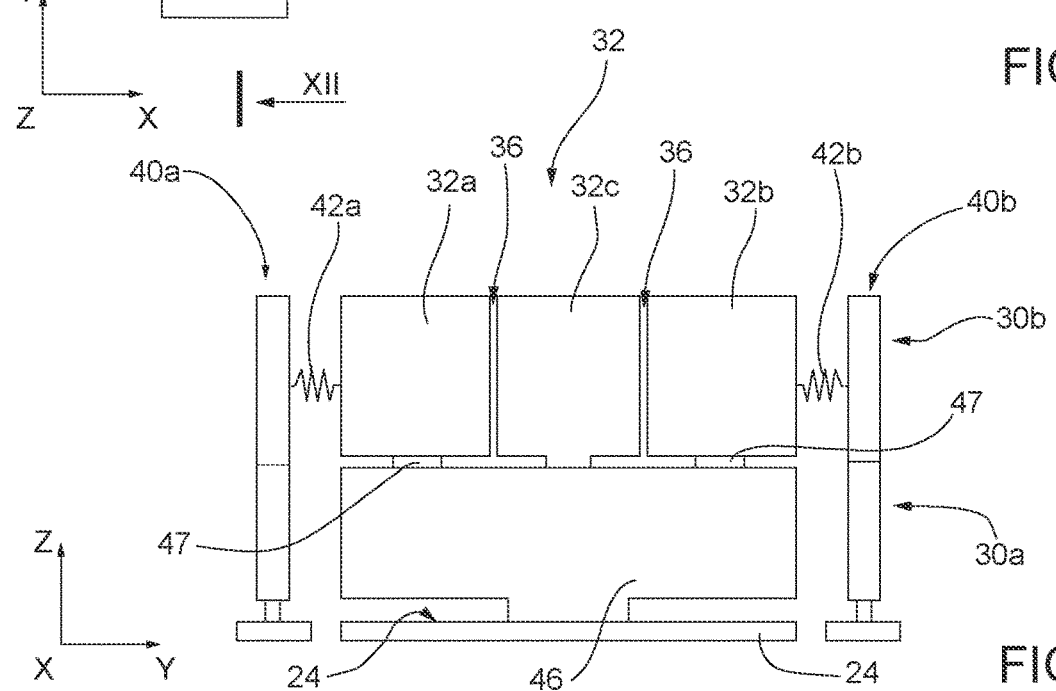
FIG. 12 is a cross-sectional view of an anchorage structure of the MEMS sensor device of FIG. 11.

As illustrated in the cross-sectional view of FIG. 12, the anchorage structure 32 is similar to the anchorage structure discussed with reference to FIG. 8 and to the third embodiment.

Figure 13:
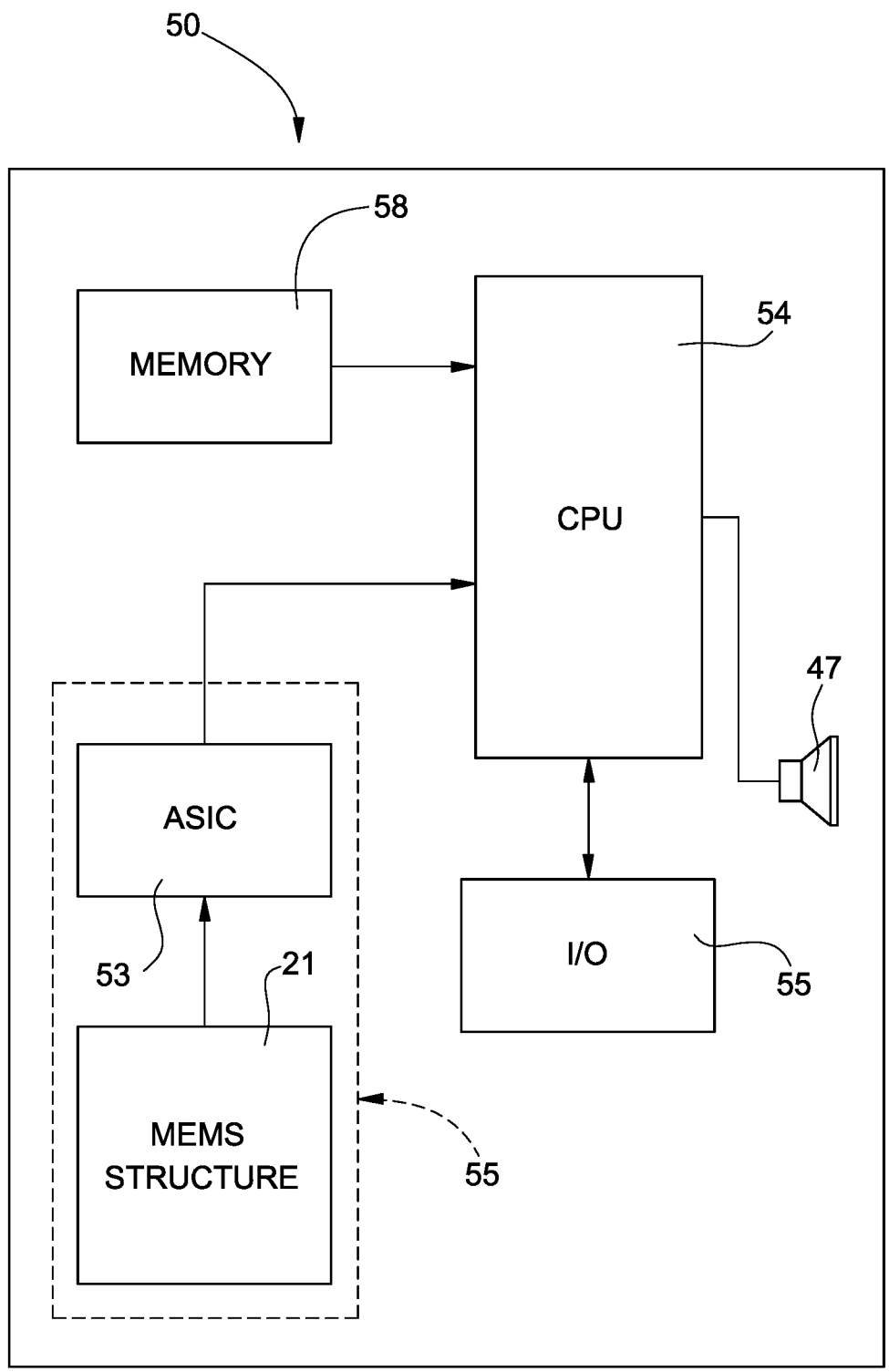
FIG. 13 is a general block diagram of an electronic apparatus incorporating a MEMS sensor device according to a further aspect of the present solution.

FIG. 13 shows an electronic apparatus 50 that utilizes the microelectromechanical sensor devices 51 described herein for detection of acceleration in horizontal or vertical axis in some embodiments.

The microelectromechanical sensor device 51 includes, in addition to the aforesaid detection structure 21, an ASIC 53, which forms the corresponding read interface (and which can be provided in the same die as the one in which the detection structure 21 is also provided or in a different die, which can in any case be housed in the same package or different packages).

The electronic apparatus 50 is, in some non-limiting examples, a portable mobile communication apparatus, such as a mobile phone, a PDA (Personal Digital Assistant), a portable computer, an audio-digital player with voice-recording capacity, a photographic camera or a video camera, a controller for video-games, or another like device. The electronic apparatus 50 is generally able to process, store, and/or transmit and receive signals and information.

The electronic apparatus 50 comprises a microprocessor 54, which receives the acceleration signals detected by the microelectromechanical sensor device 51, and an input/output interface 55, for example provided with a keypad and a display, connected to the microprocessor 54. In addition, the electronic apparatus 50 may comprise a speaker 57 for generating sounds on an audio output (not illustrated), and an internal memory 58.

The advantages of the microelectromechanical sensor device according to the present solution emerge clearly from the foregoing description.

In particular, it is emphasized that the present solution substantially reduces or eliminates drifts of electrical performance of the detection structure 21 due to the deformations of the substrate 24 that result from external stresses and stimuli such as variations of temperature or mechanical stresses. Variations in temperature and mechanical stress may be caused by soldering to a printed-circuit board the generation and dissipation of heat during use of the sensors 20 described herein, ageing, or moisture absorption, among other cause of any nature.

The detection structure 21 is in this way extremely stable, irrespective of the conditions of use and assembly in the corresponding package.

Moreover, the general detection performance, in terms, for example, of sensitivity, does not vary as compared to traditional solutions because the conformation and arrangement of the sensing electrodes with respect to the inertial mass are not modified in a manner that reduces detection performance.

Finally, it is clear that modifications and variations may be made to what has been described and illustrated herein, without thereby departing from the scope of the present disclosure, as defined in the annexed claims.

In particular, it is evident that the detection structure 21 can be arranged in the horizontal plane for detecting a component of acceleration directed along the first horizontal axis X (instead of along the second horizontal axis Y), in a way altogether similar to what has been discussed previously with reference to the first two embodiments.

Some aspects of the detection structure 21 could moreover vary without substantial modifications to the solution proposed. For instance, it is evident that the number of sensing electrodes (fixed electrodes 27a, 27b and mobile electrodes 26) could vary with respect to what has been illustrated and could include a greater number of electrodes, or else even just one set of electrodes in embodiments where a differential detection scheme is not implemented.

It is moreover clear that the solution described can be applied advantageously also in different types of MEMS sensor devices that detect capacitive variation, for example in gyroscopic sensors.

Finally, it is evident that the solution described can be implemented in uniaxial sensors, or biaxial sensors, or triaxial sensors capable of detecting accelerations (or different quantities) also along the first horizontal axis X and/or along the vertical axis Z (these sensors being provided with further structures and mobile and fixed electrodes, appropriately arranged).

A microelectromechanical sensor device (20) having a detection structure (21) may be summarized as including a substrate (24) having a top surface (24a) extending in a horizontal plane (xy); a mobile structure (22, 26), including an inertial mass (22) suspended above the substrate (24) at a first area (24') of said surface (24a) and configured to perform an inertial movement relative to said substrate (24) as a function of a quantity to be detected; and a fixed structure (27a, 27b), including fixed electrodes suspended above the substrate (24) at said first area (24') of said surface (24a) and defining with said mobile structure (22, 26) a capacitive coupling forming at least one sensing capacitor, whose capacitance value is indicative of said quantity to be detected, including a single mechanical-anchorage structure (32) for anchoring both of said mobile structure (22, 26) and fixed structure (27a, 27b) to said substrate (24), at a second area (24") of said surface (24a) distinct and separate from said first area (24'); and connection elements (34a-34c), configured to mechanically couple said mobile structure (22, 26) and said fixed structure (27a, 27b) to said single mechanical-anchorage structure (32).

Said detection structure (21) may further include a supporting element (28), to which said inertial mass (22) is coupled by elastic-coupling elements (29), compliant to said inertial movement; wherein said connection elements include a first connection element (34a) and a second connection element (34b) fixedly coupled between a respective set of said fixed electrodes (27a, 27b) and said single mechanical-anchorage structure (32), and a third connection element (34c) fixedly coupled between said supporting element (28) and said single mechanical-anchorage structure (32).

A first structural layer (30a) and a second structural layer (30b), stacked on top of one another and arranged on said substrate (24); wherein said inertial mass (22) may be mainly formed in one of said first structural layer (30a) and said second structural layer (30b), and said connection elements (34a-34c) may be formed in the other one of said structural layer (30a) and said second structural layer (30b).

Said single mechanical-anchorage structure (32) may include distinct electrical-coupling regions (32a-32c), mechanically fixed with respect to one another but electrically uncoupled so as to enable definition of separate and distinct conductive paths for electrical biasing of said fixed electrodes (27a-27b) and of said inertial mass (26), through said electrical-coupling regions (32a-32c) and said connection elements (34a-34c); wherein said connection elements (34a-34c) may be each coupled to a respective one of said electrical-coupling regions (32a-32c).

Said single mechanical-anchorage structure (32) may include trench insulation regions (36), which may be empty or filled with dielectric material and arranged to separate said electrical-coupling regions (32a-32c) from one another.

The device may further include a first electrical-anchorage structure (40a) and a second electrical-anchorage structure (40b), which may be distinct and separate from said single mechanical-anchorage structure (32) and may be electrically coupled to a first coupling region (32a) and, respectively, to a second coupling region (32b) of the mechanical-anchorage structure (32) through a first electrical-connection element (42a) and a second electrical-connection element (42b); said first and second electrical-anchorage structures (40a, 40b) being fixedly coupled to said substrate (24).

Said first and second electrical-connection elements (42a, 42b) may be elastic elements constituting a negligible mechanical coupling between said first and second electrical-anchorage structures (40a, 40b) and said first and second coupling regions (32a, 32b) of the mechanical-anchorage structure (32).

Said separate and distinct conductive paths may include a first conductive path and a second conductive path for electrical connection towards a respective set of said fixed electrodes (27a, 27b), including said first and second electrical-anchorage structures (40a, 40b); said first and second electrical-connection elements (42a, 42b); said first and second coupling regions (32a, 32b) of the mechanical-anchorage structure (32); a first connection element (34a) and a second connection element (34b), which may be fixedly coupled between a respective set of said fixed electrodes (27a, 27b) and said single mechanical-anchorage structure (32); and a third conductive path for electrical connection towards said inertial mass (22), including a third coupling region (32c) of the mechanical-anchorage structure (32) and a third connection element (34c) fixedly coupled between said single mechanical-anchorage structure (32) and a supporting element (28), to which said inertial mass (22) may be coupled by elastic-coupling elements (29).

Said first and second structural layers (30a, 30b) may be epitaxial silicon layers grown on the top surface (24a) of said substrate (24), which may be at least partially electrically and/or mechanically uncoupled from one another.

Said inertial mass (22) internally defines a window (25), in which a supporting element (28) may be arranged; said inertial mass (22) being coupled to the supporting element (28) by elastic-coupling elements (29), which may be compliant to the inertial movement.

The inertial mass (22) and the fixed electrodes (27a, 27b) may be provided in a second structural layer (30b) of the detection structure (21), at a higher level, further away from the top surface (24a) of the substrate (24); said supporting element (28) may be provided in a first structural layer (30a) of the detection structure (21), at a lower level, closer to the top surface (24a) of the substrate (24); and said connection elements (34a-34c) may be provided in the first structural layer (30a); and wherein the coupling regions (32a-32c) of said single mechanical-anchorage structure (32) are defined in the first structural layer (30a), said mechanical-anchorage structure (32) further including a covering region (38), provided in the second structural layer (30b) of the detection structure (21), arranged on said coupling regions (32a-32c), from which it is separated by a dielectric region (39).

The device may further include a first electrical-anchorage structure (40a) and a second electrical-anchorage structure (40b), which may be distinct and separate from said single mechanical-anchorage structure (32) and may be electrically coupled to a first coupling region (32a) and, respectively, to a second coupling region (32b) of the mechanical-anchorage structure (32) through a first electrical-connection element (42a) and a second electrical-connection element (42b), a third coupling region (32c) of the mechanical-anchorage structure (32) being set centrally with respect to the mechanical-anchorage structure (32) and said first and second coupling regions (32a, 32b) being arranged externally to the third coupling region (32c); said third coupling region (32c) being directly connected to a conductive pad or path formed on the surface (24a) of the substrate (24), and the first and second coupling regions (32a, 32b) being separated from the top surface (24a) of the substrate (24) by respective dielectric regions (37).

The inertial mass (22) and the fixed electrodes (27a, 27b) may be provided in a first structural layer (30a) of the detection structure (21), at a lower level, closer to the top surface (24a) of the substrate (24), and said supporting element (28) may be provided in a second structural layer (30b) of the detection structure (21), at a higher level, further away from the top surface (24a) of the substrate (24), said connection elements (34a-34c) being provided in the second structural layer (30b); and wherein the coupling regions (32a-32c) of said single mechanical-anchorage structure (32) may be defined in the second structural layer (30b), said mechanical-anchorage structure (32) may further include a monolithic anchorage portion (46), provided in the first structural layer (30a) directly coupled to an underlying conductive pad or path formed on the surface (24a) of the substrate (24); wherein a first coupling region (32a) and a second coupling region (32b) of said single mechanical-anchorage structure (32) are coupled to said monolithic anchorage portion (46) via respective dielectric regions (47), whereas a third coupling region (32c) of said single mechanical-anchorage structure (32) may be directly connected to the monolithic anchorage portion (46).

Said detection structure (21) may implement a uniaxial accelerometer configured to detect an acceleration along a horizontal axis (y) of said horizontal plane (xy); wherein said mobile structure may further include mobile electrodes (26), fixedly coupled to the inertial mass (22), arranged inside the window (25) interdigitated with the fixed electrodes (27a, 27b) of said fixed structure.

Said detection structure (21) may implement a uniaxial accelerometer configured to detect an acceleration along a vertical axis (z) orthogonal to said horizontal plane (xy); wherein said fixed electrodes (27a, 27b) may be arranged underneath the inertial mass (22), on opposite sides of said window (25).

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microelectromechanical sensor device, comprising:
   a substrate having a first surface with a first area and a second area, the second area positioned outside of the first area in a lateral direction;
   a mobile structure including an inertial mass suspended above the substrate at the first area of the first surface;
   a fixed structure including fixed electrodes suspended above the substrate at the first area of the first surface;
   at least one sensing capacitor including the mobile structure capacitively coupled to the fixed structure;
   a single monolithic anchor coupled to the substrate at the second area, the single monolithic anchor coupled to the mobile structure and the fixed structure; and
   a plurality of connection elements coupled to the mobile structure, the fixed structure, and to the single monolithic anchor.

2. The microelectromechanical sensor device according to claim 1, further comprising:
   a supporting element;
   a plurality of elastic coupling elements coupled to the inertial mass and the supporting element, the plurality of connection elements including:
      a first connection element and a second connection element coupled to a respective set of the fixed electrodes and the single monolithic anchor; and
      a third connection element coupled to the supporting element and the single monolithic anchor.

3. The microelectromechanical sensor device according to claim 1, further comprising:
   a first structural layer on the substrate; and
   a second structural layer on the substrate and stacked on the first structural layer, a first one of the first structural layer and the second structural layer including the inertial mass and a second one of the first structural layer and the second structural layer including the plurality of connection elements.

4. The microelectromechanical sensor device according to claim 2 wherein the single monolithic anchor includes distinct electrical-coupling regions coupled to the plurality of connection elements, the electrical-coupling regions mechanically coupled to each other and electrically isolated from each other to define separate and distinct conductive paths through the electrical-coupling regions and the plurality of connection elements.

5. The microelectromechanical sensor device according to claim 4 wherein the single monolithic anchor includes trench insulation regions arranged between the electrical-coupling regions.

6. The microelectromechanical sensor device according to claim 4 wherein the single monolithic anchor includes a first coupling region and a second coupling region, the microelectromechanical sensor device further comprising:
   a first electrical anchor coupled to the substrate;
   a second electrical anchor coupled to the substrate, the first and second electrical anchors distinct and separate from the single monolithic anchor;
   a first electrical connection element electrically coupled to the first coupling region of the single monolithic anchor and the first electrical anchor; and a second electrical connection element electrically coupled to the second coupling region of the single monolithic anchor and the second electrical anchor.

7. The microelectromechanical sensor device according to claim 6 wherein the first and second electrical connection elements are elastic elements including a negligible mechanical coupling between the first and second electrical anchors and the first and second coupling regions of the single monolithic anchor.

8. The microelectromechanical sensor device according to claim 6 wherein the single monolithic anchor includes a third coupling region, the separate and distinct conductive paths including:
   a first conductive path and a second conductive path for electrical connection between a respective set of the fixed electrodes, the first and second conductive paths including:
      the first and second electrical anchors;
      the first and second electrical connection elements;
      the first and second coupling regions of the single monolithic anchor;
      a first connection element and a second connection element of the plurality of connection elements coupled between the respective set of said fixed electrodes; and
      the single monolithic anchor; and
   a third conductive path for electrical connection to the inertial mass, including:
      the third coupling region of the single monolithic anchor; and
      a third connection element of the plurality of connection elements coupled between the single monolithic anchor and the supporting element.

9. The microelectromechanical sensor device according to claim 1 further comprising first and second structural layers that are epitaxial silicon layers on the first surface of the substrate that are at least partially electrically or mechanically isolated from each other, or both.

10. The microelectromechanical sensor device according to claim 1, further comprising:
   a window through the inertial mass;
   a supporting element arranged in the window; and
   a plurality of elastic coupling elements coupled to the inertial mass and the supporting element.

11. The microelectromechanical sensor device according to claim 10 wherein the single monolithic anchor includes a plurality of coupling regions, a cover region on the plurality of coupling regions, and a first dielectric region between the plurality of coupling regions and the cover region, the microelectromechanical sensor device further comprising:
   a first structural layer on the substrate including:
      the supporting element;
      the plurality of connection elements; and
      the plurality of coupling regions of the single monolithic anchor; and
   a second structural layer on the first structural layer and positioned further from the first surface than the first structural layer, the second structural layer including:
      the inertial mass;
      the fixed electrodes; and the cover region of the single monolithic anchor.

12. The microelectromechanical sensor device according to claim 11 wherein the plurality of coupling regions of the single monolithic anchor includes a first coupling region, a second coupling region, and a third coupling region, the microelectromechanical sensor device further comprising:
   a plurality of second dielectric regions between the first and second coupling regions of the single monolithic anchor and the substrate;
   a first electrical anchor;
   a second electrical anchor, the first and second electrical anchors being distinct and separate from the single monolithic anchor;
   a first electrical connection element electrically coupled to the first electrical anchor and the first coupling region of the single monolithic anchor;
   a second electrical connection element electrically coupled to the second electrical anchor and the second coupling region of the single monolithic anchor; and
   a conductive path on the first surface of the substrate, the third coupling region directly coupled to the conductive path.

13. The microelectromechanical sensor device according to claim 10 wherein the single monolithic anchor includes a plurality of coupling regions and a monolithic anchor portion, the plurality of coupling regions including a first coupling region, a second coupling region, and a third coupling region, the third coupling region directly coupled to the monolithic anchor portion, the microelectromechanical sensor device further comprising:
   a conductive path on the first surface of the substrate directly coupled to the monolithic anchor portion of the single monolithic anchor;
   a first structural layer on the substrate, including:
      the inertial mass;
      the fixed electrodes; and
      the monolithic anchor portion of the single monolithic anchor;
   a second structural layer on the first structural layer and positioned further away from the first surface of the substrate than the first structural layer, the second structural layer including:
      the plurality of connection elements; and
      the plurality of coupling regions of the single monolithic anchor; and
   a plurality of dielectric regions coupled to the monolithic anchor portion and the first coupling region and the second coupling region of the single monolithic anchor.

14. The microelectromechanical sensor device according to claim 10 wherein the mobile structure further includes mobile electrodes coupled to the inertial mass and arranged inside the window and interdigitated with the fixed electrodes.

15. The microelectromechanical sensor device according to claim 10 wherein the fixed electrodes are positioned closer to the substrate than the inertial mass and on opposite sides of the window.

16. A microelectromechanical sensor device, comprising:
   a substrate;
   a mobile structure coupled to the substrate and including an inertial mass and a plurality of mobile electrodes;
   a window through the inertial mass;
   a fixed structure coupled to the substrate and including a plurality of fixed electrodes capacitively coupled to the mobile electrodes;
   a single monolithic anchor coupled to the substrate and positioned outside of the window; and
   a plurality of connection elements coupled to the mobile structure, the fixed structure, and the single monolithic anchor.

17. The microelectromechanical sensor device of claim 16, further comprising:

a first structural layer on the substrate including the mobile structure and the fixed structure; and a second structural layer on the first structural layer and positioned further from the substrate than the first structural layer, the second structural layer including the plurality of connection elements.

18. The microelectromechanical sensor device of claim 16, further comprising:

a first structural layer on the substrate including the plurality of connection elements; and a second structural layer on the first structural layer and positioned further from the substrate than the first structural layer, the second structural layer including the mobile structure and the fixed structure.

19. A system, comprising:

a microelectromechanical device including:

a substrate with a first area and a second area separate from the first area; and a detection structure positioned in the first area, including:

an inertial mass;

a plurality of mobile electrodes; and a plurality of fixed electrodes capacitively coupled to the plurality of mobile electrodes;

a single monolithic anchor coupled to the substrate positioned in the second area; and a plurality of connection elements coupled to the detection structure and the single monolithic anchor, the plurality of connection elements extending between the first area and the second area.

20. The system of claim 19, further comprising:

a first structural layer on the substrate; and a second structural layer on the first structural layer and positioned further from the substrate than the first structural layer, a first one of the first structural layer and the second structural layer including the detection structure and a second one of the first structural layer and the second structural layer including the plurality of connection elements.

* * * * *